United States Patent [19]

Kasper et al.

[11] 4,311,743
[45] Jan. 19, 1982

[54] SEMICONDUCTOR-GLASS COMPOSITE MATERIAL AND METHOD FOR PRODUCING IT

[75] Inventors: Erich Kasper, Senden; Suso Weber, Langenau, both of Fed. Rep. of Germany

[73] Assignee: Licentia Patent-Verwaltungs GmbH, Frankfurt am Main, Fed. Rep. of Germany

[21] Appl. No.: 80,948

[22] Filed: Oct. 1, 1979

[30] Foreign Application Priority Data

Sep. 29, 1978 [DE] Fed. Rep. of Germany ....... 2842492

[51] Int. Cl.³ .................. B32B 3/02; B32B 17/06; C03B 27/00
[52] U.S. Cl. .................................. 428/64; 313/94; 156/308.2; 65/41; 427/87; 427/74; 428/426; 428/428; 428/697; 428/699; 428/701; 428/702; 428/432
[58] Field of Search ............... 428/432, 426, 428, 701, 428/702, 699, 697, 64; 427/87, 74; 156/308.2; 65/41; 313/94

[56] References Cited

U.S. PATENT DOCUMENTS

| | | | |
|---|---|---|---|
| 3,241,010 | 3/1966 | Eddleston | 428/428 |
| 3,408,222 | 10/1968 | Navias | 428/428 |
| 3,415,680 | 12/1968 | Perri | 428/432 |
| 3,637,425 | 1/1972 | McMillan | 428/428 |
| 3,689,357 | 9/1972 | Jordan | 428/428 |
| 3,909,332 | 9/1975 | Yerman | 428/428 |
| 3,914,136 | 10/1975 | Kressel | 427/87 |
| 4,002,799 | 1/1977 | Dumesnel | 428/428 |
| 4,133,690 | 1/1969 | Muller | 428/426 |

*Primary Examiner*—Ellis P. Robinson
*Attorney, Agent, or Firm*—Spencer & Kaye

[57] ABSTRACT

A semiconductor-glass composite material comprises at least one semiconductor bonded to a glass substrate, with the semiconductor layer having a strain $\epsilon \leq 0.3$ per mil, and a dislocation density $N_V \leq 2 \times 10^6$ cm$^{-2}$. In a process for producing the semiconductor-glass composite material, the semiconductor and glass are heated to a bonding temperature, bonded under pressure, and tempered at a temperature $T_a$ such that the viscosity of the glass at $T_a$ is $10^{12}$ to $10^{13.5}$ poise, and the following relationship holds:

$$\left| \int_{T=25°C.}^{T=T_a} [\alpha_G(T) - \alpha_S(T)] \, dT \right| < 3 \times 10^{-4}$$

wherein $\alpha_G$ and $\alpha_S$ are the coefficients of expansion of the glass and semiconductor, respectively, and T is temperature. The composite material is then cooled to room temperature.

9 Claims, 2 Drawing Figures

SEMICONDUCTOR-GLASS COMPOSITE MATERIAL AND METHOD FOR PRODUCING IT

BACKGROUND OF THE INVENTION

The present invention relates to a semiconductor-glass composite material and to a method for producing it.

Known semiconductor-glass composite materials generally do not exhibit satisfactory characteristics due to intense elastic deformation and a high dislocation density in the semiconductor component, which result from the highly nonlinear thermal expansion of the glass at higher temperatures.

SUMMARY OF THE PRESENT INVENTION

It is an object of the present invention to provide a novel semiconductor-glass composite material which has improved properties.

Another object of the present invention is to provide a novel semiconductor-glass composite material with substantially reduced elastic distortions and reduced dislocation density in the semiconductor material.

It is a further object of the present invention to provide a method for producing this novel semiconductor-glass composite material.

To achieve these objects and in accordance with its purpose, the present invention provides a semiconductor-glass composite material comprising at least one semiconductor layer bonded to a glass substrate, with the semiconductor layer having a strain $\epsilon \leq 0.3$ per mil and a dislocation density $N_V \leq 2 \times 10^6$ cm$^{-2}$.

In another aspect, the present invention provides a method for producing a semiconductor-glass composite material, in which at least one semiconductor layer is permanently bonded to a glass substrate, wherein the semiconductor layer has a strain $\epsilon \leq 0.3$ per mil and a dislocation density $N_V \leq 2 \times 10^6$ cm$^{-2}$, comprising: heating the semiconductor and glass together to a bonding temperature, bonding the semiconductor and glass together at the bonding temperature under the influence of pressure to form a composite material, tempering the composite material at a temperature $T_a$ which lies between the bonding temperature and room temperature, and at which the viscosity of the glass is from $10^{12}$ to $10^{13.5}$ poise and at which $$\left| \int_{T=25°\,C.}^{T=T_a} [\alpha_G(T) - \alpha_S(T)] \, dT \right| < 3 \times 10^{-4}$$

wherein $\alpha_G$ and $\alpha_S$ are the coefficients of expansion of the glass and semiconductor respectively, and T is temperature, and subsequently cooling the composite material to room temperature.

It is to be understood that both the foregoing general description and the following detailed description are exemplary, but are not restrictive of the invention.

BRIEF DESCRIPTION OF THE DRAWINGS

The figures show a semiconductor-glass composite material produced according to the process of the present invention and a preferred structure of the semiconductor layer.

DETAILED DESCRIPTION OF THE INVENTION

Figure 1:
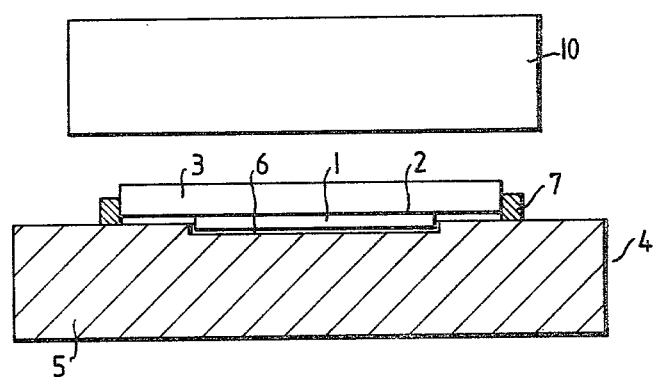

To produce the semiconductor-glass composite material of the present invention, glass, generally in the shape of a disc, and semiconductor are together brought to a bonding temperature $T_c$ and bonded under pressure to form a composite material. This bonding temperature will be in the range of about 580° C. to about 700° C., preferably about 630° C. to 670° C. The pressure may be supplied by means of a weight placed on top of the semiconductor-glass composite, or by any other convenient means. A pressure of about 30 to 5000 g/cm$^2$ is typical, and is generally applied for about 1 to 30 minutes.

Thereafter, the composite is not immediately cooled steadily to room temperature, but is tempered at a temperature $T_a$ for at least 15 minutes. This tempering temperature, which is between the bonding temperature and room temperature (which is about 25° C.) is selected so that the viscosity $\eta_a$ of the glass component of the composite material during the tempering process (at $T_a$) is between about $10^{12}$ and about $10^{13.5}$ poise. Further, the tempering temperature is selected so that the following relationship holds:

$$\left| \int_{T=25°\,C.}^{T=T_a} [\alpha_G(T) - \alpha_S(T)] \, dT \right| < 3 \times 10^{-4}$$

wherein $\alpha_G$ and $\alpha_S$ are the coefficients of expansion of the glass and semiconductor, respectively, and T is temperature.

Upon completion of the tempering process, the composite material is cooled to room temperature. The cooling rate r is selected in dependence on the viscosity of the glass at $T_a$ according to the relationship.

$$r \geq \frac{2 \times 10^{13}}{\eta_a} \, °K./min.$$

The method according to the present invention makes possible the manufacture of a semiconductor glass composite material having substantially reduced elastic distortions and a reduced dislocation density in the semiconductor material. Preferably, the strain $\epsilon$ is $\leq 0.3$ per mil and the dislocation density in the semiconductor material $N_V$ is $\leq 2 \times 10^6$ cm$^{-2}$. $\epsilon$ may be as low as 0.03 per mil and $N_V$ as low as $10^{-4}$ cm$^{-2}$.

The type of glass perferred for use in the process of the present invention is a hard glass having for example components like boric oxide and/or zinc oxide. A particularly preferred glass is ZKN7, manufactured by Jenaer Glaswerk Schott & Gen., Mainz W. Germany. This glass contains a zinc oxide component.

The types of semiconductor materials preferred for use in the present invention are Group III/V-compounds and silicon. A particularly preferred semiconductor is gallium arsenide (GaAs). The method according to the invention is also particularly well suited for combining a glass substrate with a semiconductor comprising superposed layers of various materials, for instance a plurality of gallium arsenide and gallium aluminum arsenide.

The composite material produced by the method of the present invention is suited for use as a photocathode, and is advisably utilized as a photosensitive component of an image amplifier tube.

Embodiments of the invention which will be explained in detail with the aid of the drawings in FIGS. 1 and 2, the novel composite material is made of the semiconductor GaAs and the glass is the previously mentioned ZKN7.

From a substrate plate of GaAs having a thickness of 300μ and Zn doping of $5 \times 10^{17}/cm^3$, a semiconductor disc 1 having a 20 mm diameter is cut by means of ultrasonic drilling. One side 2 of disc 1 is polished.

A glass disc 3, type ZKN7, is produced with a diameter of 32 mm and a thickness of 3 mm. Both sides of disc 3 are polished.

Glass disc 3 and semiconductor disc 1 are mounted temporarily on a ceramic mount 4 so that polished side 2 of GaAs disc 1 contacts glass 3. Ceramic mount 4 comprises a circular bottom plate 5 of about 1 cm thickness and 50 mm diameter. Plate 5 contains a circular recess 6 having a depth of 100μ and a diameter of 20.5 mm and an alignment aid 7 surrounds recess 6. Alignment aid 7 is designed in the form of a circular ring, having a height of 2 mm, a wall thickness of 1 mm and an inner diameter of 32.5 mm.

Ceramic mount 4 is introduced into a furnace together with glass 3 and semiconductor disc 1 disposed thereon and is heated to the bonding temperature of 660° C.

In order to further the bonding process, a weight 10 of about 150 g which is disposed in a vertically displaceable holder (not shown) is placed onto glass 3 and removed after about 10 minutes.

Thereafter, the furnace temperature is lowered to the tempering temperature $T_a$ of 555° C. and is held at this temperature for at least 15 minutes, preferably 30 minutes. At this temperature the following relationship exists for the glass and semiconductor used:

$$\left| \int_{T = 25° C.}^{T = 555° C.} [\alpha_G(T) - \alpha_S(T)] \, dT \right| = + 1 \times 10^{-4}$$

The viscosity of the glass ZKN7, at 555° C. is $$\eta_a = 2.3 \times 10^{12} \text{ poise.}$$

The composite material is then cooled to room temperature at a cooling rate r of 9° K./min.

A composite of GaAs and glass produced according to this method displays elastic distortions of $\epsilon \leq 0.2$ per mil and a dislocation density of $1.1 \times 10^6/cm^2$.

Figure 2:
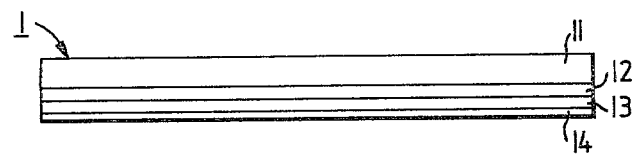

FIG. 2 shows another preferred embodiment of a semiconductor disc according to the invention in which the semiconductor 1 comprises several superposed layers of various semiconductor materials. For example the semiconductor disc 1 consists of a gallium arsenide substrate 11, a gallium aluminium arsenide layer 12, a gallium arsenide layer 13 and a further gallium aluminium arsenide layer 14. The layers may be grown onto the substrate by means of liquid phase epitaxy.

It will be understood that the above description of the present invention is susceptible to various modifications, changes and adaptations, and the same are intended to be comprehended within the meaning and range of equivalents of the appended claims.

What is claimed is:

1. Gallium arsenide photocathode comprising a semiconductor-glass composite material produced by combining a semiconductor layer with a disc-shaped glass substrate under conditions of elevated temperature and pressure, wherein said glass substrate and said conditions of temperature and pressure have been selected such that said semiconductor layer of said composite material has a strain $\epsilon \leq 0.3$ per mil and dislocation density $N_v \leq 2 \times 10^6$ cm$^{-2}$.

2. A semiconductor-glass composite material according to claim 1 wherein the glass substrate is made of ZKN7 glass, and the semiconductor layer comprises zinc-doped gallium arsenide.

3. A semiconductor-glass composite material according to claim 1 wherein, the glass substrate is ZKN7 glass, and the semiconductor layer comprises a plurality of superposed layers of gallium arsenide and gallium aluminum arsenide.

4. A composite material as defined in claim 1, 2 or 3 which is used as a photosensitive component of an image amplifier tube.

5. A method for producing a semiconductor-glass composite material, in which at least one semiconductor layer is permanently bonded to a glass substrate, wherein the semiconductor layer has a strain $\epsilon \leq 0.3$ per mil and a dislocation density of $N_V \leq 2 \times 10^6$, comprising:

heating the semiconductor and glass together to a bonding temperature; bonding the semiconductor and glass together at the bonding temperature under the influence of pressure, to form a composite material; tempering the composite material at a temperature $T_a$ which lies between the bonding temperature and room temperature, and at which the viscosity of the glass is from $10^{12}$ to $10^{13.5}$ poise, and at which $$\left| \int_{T=25° C.}^{T=T_a} [\alpha_G(T) - \alpha_S(T)] \, dT \right| < 3 \times 10^{-4}$$

wherein $\alpha_G$ and $\alpha_S$ are the coefficients of expansion of the glass and semiconductor, respectively, and T is temperature; and subsequently cooling the composite material to room temperature.

6. The method of claim 5 wherein said glass substrate is made of ZKN7 glass, and said semiconductor layer comprises zinc-doped gallium arsenide.

7. The method of claim 5 wherein said glass substrate is made of ZKN7 glass, and said semiconductor layer comprises a plurality of superposed layers of gallium arsenide and gallium aluminum arsenide.

8. Method as defined in claim 5 wherein the tempering is carried out for a time of at least 15 minutes.

9. Method as defined in claims 5, 6, 7, or 8 wherein the step of cooling the composite material to room temperature, after termination of the step of tempering, is carried out at a rate $$r \geq \frac{2 \times 10^{13} \cdot °K./min.}{\eta_a}$$

wherein $\eta_a$ is the viscosity measured in poise, of the glass at tempering temperature $T_a$.

* * * * *